United States Patent [19]

Yamamoto et al.

[11] Patent Number: 4,655,597
[45] Date of Patent: Apr. 7, 1987

[54] MICRO-DISPLACEMENT MEASURING APPARATUS USING A SEMICONDUCTOR LASER

[75] Inventors: Osamu Yamamoto; Sadayoshi Matsui, both of Nara; Haruhisa Takiguchi, Osaka; Hiroshi Hayashi, Kyoto; Nobuyuki Miyauchi, Nara, all of Japan

[73] Assignee: Sharp Kabushiki Kaisha, Osaka, Japan

[21] Appl. No.: 739,013

[22] Filed: May 29, 1985

[30] Foreign Application Priority Data

Jun. 1, 1984 [JP] Japan .................................. 59-113619

[51] Int. Cl.⁴ ............................................ G01B 11/00
[52] U.S. Cl. ..................................................... 356/373
[58] Field of Search .................................. 356/373, 375

[56] References Cited

U.S. PATENT DOCUMENTS 3,476,483 11/1969 Weeks ............................. 356/373 X
3,514,207 5/1970 De Lang et al. ............... 356/373 X

FOREIGN PATENT DOCUMENTS 0071401 4/1983 Japan ................................... 356/373

Primary Examiner—F. L. Evans
Attorney, Agent, or Firm—Spencer & Frank

[57] ABSTRACT

A micro-displacement measuring apparatus using a semiconductor laser, comprises a compound resonator system containing the semiconductor laser, and a light detector receiving the light from the semiconductor laser, and with the compound resonator system being constructed such that light from said laser irradiates an object to be measured and the reflected light therefrom returns to the semiconductor laser. The light detector detects and measures the number of fluctuations and the level of the optical output of the laser to determine the displacement of the object and of the direction of the displacement of the object, respectively.

3 Claims, 3 Drawing Figures

MICRO-DISPLACEMENT MEASURING APPARATUS USING A SEMICONDUCTOR LASER

BACKGROUND OF THE INVENTION

1. Field of the Invention

This invention relates to a micro-displacement measuring apparatus which can attain accurate and ready measurement of micro-amounts and the direction of displacement of objects.

2. Description of the Prior Art

As measuring methods for measuring the amount of displacement of an object to be measured, the following have been used: (1) a method using dial gauges; (2) a method using optical levers; (3) a method using variation of the capacity of condensers; (4) a method using differential transformers; (5) a method using optical interference, etc. However, methods (1) and (2) are disadvantageous in that the micro-displacement of the object cannot be measured. Methods (1), (3) and (4) are also disadvantageous in that measuring probes must be connected to the object. Method (3) is also inferior in that a linear relationship cannot be attained between the variation of the capacity of the condensers and the micro-displacement of the object. Method (5) is inferior in that since the movement of the interference pattern must be observed to detect the direction of displacement of the object, the direction thereof cannot be readily detected.

SUMMARY OF THE INVENTION

The micro-displacement measuring apparatus of this invention overcomes the above-discussed disadvantages and other numerous drawbacks and deficiencies of the prior art, and comprises a compound resonator system containing a semiconductor laser, and a light detector receiving light from said semiconductor laser; said compound resonator system being constructed such that the light from said laser irradiates the object to be measured and the reflected light therefrom returns to said semiconductor laser.

The compound resonator system comprises, in a preferred embodiment, a semiconductor laser, a collimator lens for producing a beam of parallel rays of light from said semiconductor laser, and a beam splitter for dividing the parallel rays of light into two elements at right angles to each other, one of which is directed to said object and the other of which is directed to said light detector.

An alternative compound resonator system comprises, in a preferred embodiment, a semiconductor laser, a collimator lens for producing a beam of parallel rays of light from said semiconductor laser, and a condensing lens for condensing the parallel rays of light on the object.

Thus, the invention described herein makes possible the objects of (1) providing a micro-displacement measuring apparatus which can readily and accurately measure the micro-displacement of an object in a non-contact manner, and (2) providing a micro-displacement measuring apparatus which can readily and accurately detect the direction of displacement of the object in a non-contact manner.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
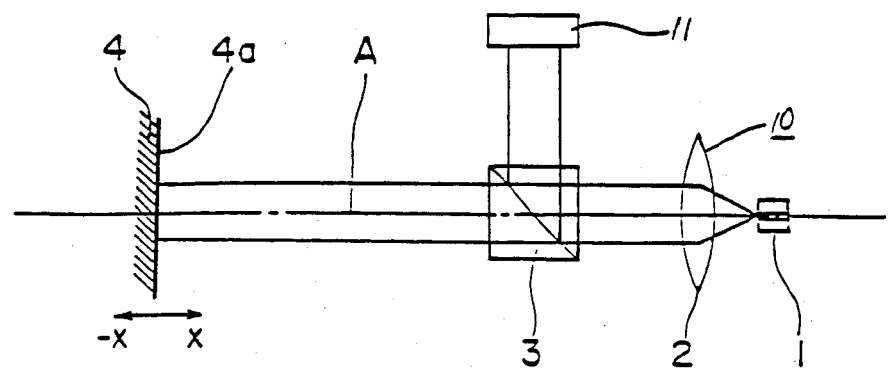
FIG. 1 is a schematic illustration of an embodiment of an apparatus according to this invention.

FIG. 1 shows one embodiment of an apparatus according to this invention which comprises a compound resonantor system 10 and a light detector 11. The compound resonator system 10 comprises a semiconductor laser 1, a collimator lens 2 for producing a beam of parallel rays of light from the semiconductor laser 1, and a beam splitter 3 for dividing the parallel rays of light from the laser 1 into two elements or components at right angles to each other, one of which is directed to an object 4 to be measured and the other of which is directed to the light detector 11. The semiconductor laser 1, the collimator lens 2, the beam splitter 3 and the object are successively disposed on an optical axis A. The face 4a of the object 4 to be measured is at a right angle to the optical axis A and the light detector 11 is at a right angle to the axis A to receive the light from the beam splitter 3.

Light from the semiconductor laser 1 passes through the collimator lens 2 to produce a beam of parallel rays of light which is then divided into two elements at right angles to each other by means of the beam splitter 3. One of the two elements irradiates the face 4a of the object 4 at a right angle, reflects from the object 4 and returns by the same path to the semiconductor laser 1. The other element of the parallel rays of light from the beam splitter 3 goes to the light detector 11, whereby the optical output of the semiconductor laser 1 is measured.

Figure 2:
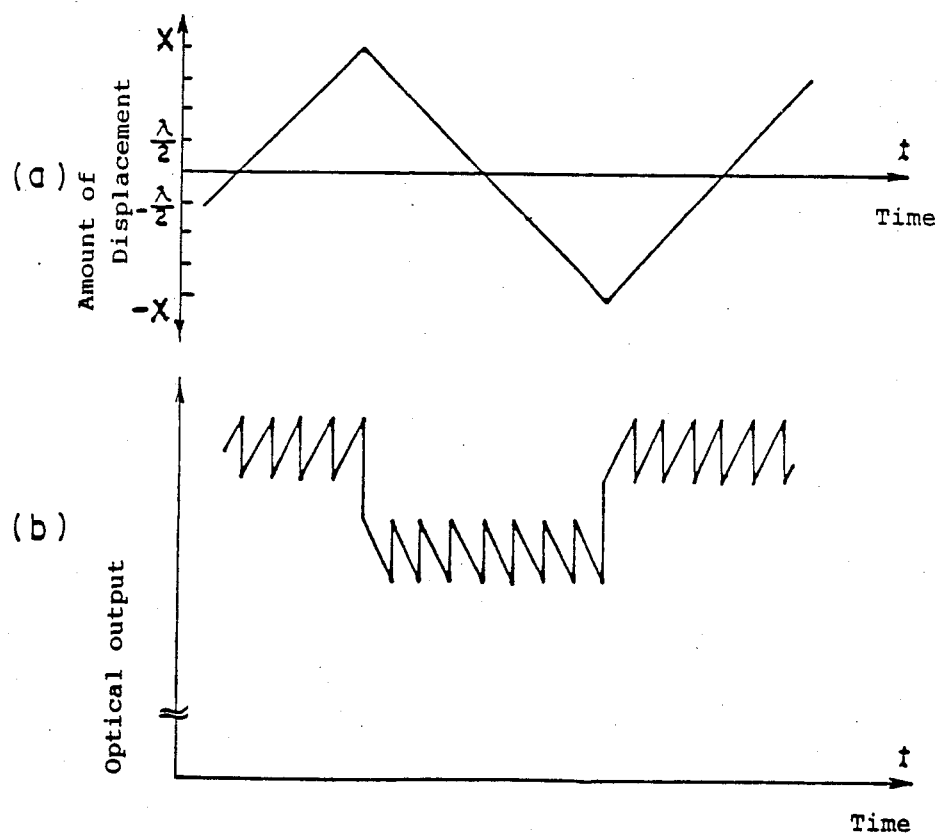
FIG. 2 is an operational illustration showing the relationship between the displacement of the object and the optical output of the semiconductor laser, with FIG. 2(a) showing the displacement of the object with the elapse of time and FIG. 2(b) showing the variation of the optical output of the semiconductor laser.

In the case in which the intensity of the reflected light is constant at a level, when the object 4 is displaced toward the X or the −X direction in FIG. 1, the optical output of the semiconductor laser 1 varies for each $\lambda/2$ ($\lambda$: oscillation wavelength) variation in the amount of displacement X based on the phase relationship between the oscillated light from the semiconductor laser 1 and the reflected light from the object 4, resulting in a "swing" of the optical output. The inventors of this invention found that when the direction of displacement of the object 4 is toward the X direction, which is closer to the semiconductor laser 1 than the −X direction, the optical output level of the laser 1 increases, while when the displacement of the object 4 is toward the −X direction, the optical output level is reduced. For instance, as shown in FIG. 2(a), when the object 4 is displaced ranging from $\lambda$ in the X direction to $\lambda$ in the −X direction, the optical output of the semiconductor laser 1 (i.e., the optical input to the light detector 11) varies as shown in FIG. 2(b). This indicates that the amount of displacement for every $\lambda/2$ of the object 4 corresponds to the number of swings or fluctuations of the optical input to the light detector 11 in the proportion of 1 to 1, and that the level of the optical output of the semiconductor laser 1 (i.e., the level of the input to the light detector 11) decreases or increases as the displacement of the object 4 is directed away from the semiconductor laser 1 or is directed in the opposite direction therefrom.

As mentioned above, the amount of displacement and the direction of displacement of the object 4, respectively, correspond to the variation of the optical output of the semiconductor laser 1. Thus, by detecting the number of swings and the level of the optical output by means of the light detector 11, the amount and the direction of displacement of the object 4 can be realized, respectively. When the displacement of the object 4 is carried out periodically, the amplitude, the number of vibrations or the like thereof can be realized.

In the case in which the object 4 cannot reflect the laser light, a reflecting mirror can be attached to the object 4 to effect the above-mentioned measurements.

Figure 3:
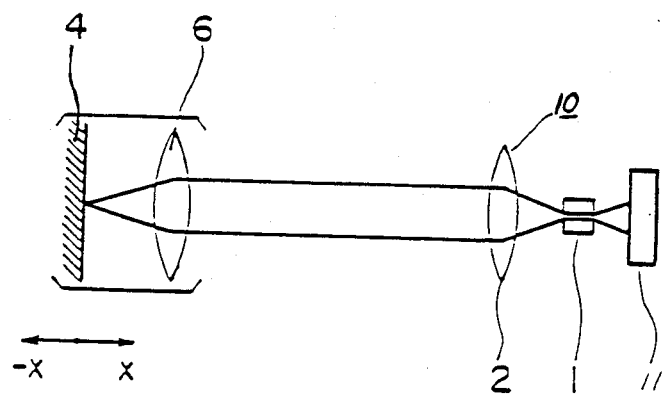
FIG. 3 is a schematic illustration of another embodiment of the apparatus according to this invention.

FIG. 3 shows another embodiment of an apparatus according to this invention which comprises a compound resonator system 10 and a light detector 11, as well. The compound resonator system 10 is different from that in FIG. 1 in that a condensing lens 6 instead of the beam splitter 3 is disposed on the optical axis A to condense the parallel rays of light from the collimater lens 2 on the object 4. The light detector 11 is disposed behind the semiconductor laser 1 in a manner to directly receive the laser light therefrom.

The accuracy of the above-mentioned measurements is, of course, improved when the semiconductor laser 1 is operated at a stabilized temperature. So long as the requirements set forth in the attached claims are satisfied, specified materials and structures, specified oscillation wavelengths, etc., are not required for the semiconductor laser 1.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A micro-displacement measuring apparatus using a semiconductor laser which comprises: a compound resonator system containing said semiconductor laser, with said compound resonator system being constructed such that light from said laser irradiates an object to be measured and the reflected light therefrom returns to said semiconductor laser; and a light detector means for receiving light from said semiconductor laser and for detecting the number of fluctuations and the level of the optical output of said semiconductor laser to determine the amount of displacement of said object and the direction of displacement of said object, respectively.

2. A micro-displacement measuring apparatus using a semiconductor laser according to claim 1, wherein said compound resonator system comprises said semiconductor laser, a collimator lens for producing a beam of parallel rays of light from said semiconductor laser, and a beam splitter for dividing the parallel rays of light into two elements at right angles to each other, one of which is directed to said object and the other of which is directed to said light detector means.

3. A micro-displacement measuring apparatus using a semiconductor laser according to claim 1, wherein said compound resonator system comprises said semiconductor laser, a collimator lens for producing a beam of parallel rays of light from said semiconductor laser, and a condensing lens for condensing the parallel rays of light on the object.

* * * * *